United States Patent
Ishida et al.

(10) Patent No.: US 7,276,979 B2
(45) Date of Patent: Oct. 2, 2007

(54) OSCILLATION DEVICE AND MOBILE COMMUNICATION APPARATUS

(75) Inventors: Kaoru Ishida, Shijonawate (JP); Toshiakira Ando, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 359 days.

(21) Appl. No.: 10/969,927

(22) Filed: Oct. 22, 2004

(65) Prior Publication Data
US 2005/0090218 A1  Apr. 28, 2005

(30) Foreign Application Priority Data
Oct. 24, 2003  (JP)  ............................. 2003-364336

(51) Int. Cl.
*H03H 5/12* (2006.01)
*H03L 7/085* (2006.01)

(52) U.S. Cl. ................ 331/17; 331/36 C; 331/117 FE; 331/177 V

(58) Field of Classification Search .................. 331/17, 331/25, 36 C, 117 R, 117 FE, 117 D, 177 V
See application file for complete search history.

(56) References Cited

U.S. PATENT DOCUMENTS 5,677,648 A  10/1997  Jones
6,281,758 B1  8/2001  Elsayed et al.
2004/0066244 A1*  4/2004  Takinami et al. ........ 331/117 R

FOREIGN PATENT DOCUMENTS

| JP | 6280421 | 5/1987 |
| JP | 28221 | 1/1990 |
| JP | 04223601 | 8/1992 |
| JP | 7297710 | 11/1995 |
| JP | 2000332602 | 11/2000 |
| JP | 2001339300 | 12/2001 |

OTHER PUBLICATIONS

B. Razavi; "RF Microelectronics 1st Edition—Cased," Prentice Hall, Dec. 1997, ISBN: 0-13-887571-5, pp. 234-303 with English translation pp. 212-277.
Japanese Office Action dated Jul. 13, 2007 with English translation.

\* cited by examiner

*Primary Examiner*—David Mis
(74) *Attorney, Agent, or Firm*—Stevens, Davis, Miller & Mosher, LLP

(57) ABSTRACT

A differential type voltage control oscillator is formed of a differential tank circuit, an oscillation transistor, and a differential variable capacitance circuit. The differential variable capacitance circuit has a configuration wherein at least one pair of varactor diodes are connected in an anti-parallel manner, and are separated by means of a plurality of capacitors in a direct current manner. In addition, a differential control voltage is generated by a charge pump circuit which is controlled by the output of a phase comparator, and the differential control voltage is directly applied across the anodes and the cathodes of the varactor diodes.

16 Claims, 9 Drawing Sheets

OSCILLATION DEVICE AND MOBILE COMMUNICATION APPARATUS

BACKGROUND OF THE INVENTION

1. Field of the Invention

The present invention relates to an oscillation device that is utilized for a wireless terminal device of, for example, a mobile communication apparatus. Such an oscillation device is formed by including a voltage control oscillator for controlling the output phase by using, for example, a PLL circuit.

2. Prior Art

In recent years, major portions of high frequency wireless circuits have been implemented on semiconductors in wireless terminal devices of mobile communication apparatuses as a result of the pursuit of miniaturization. In such a circumstance, oscillators, which are the core parts of wireless devices, are also integrated on semiconductors. Differential type voltage control oscillators are mainly used as such oscillators.

A differential type voltage control oscillator has a circuit configuration as that shown in FIG. 4, which is characterized in that noise in common mode is small. In FIG. 4, symbol 401 indicates a power supply terminal. Symbol 402 indicates a constant current source. Symbols 403a and 403b indicate inductors. Symbol 403 indicates a differential tank circuit formed of inductors 403a and 403b. Symbol 404 indicates a control voltage terminal. Symbols 405a and 405b indicate varactor diodes. Symbol 405 indicates a differential variable capacitance circuit formed of varactor diodes 405a, 405b and control voltage terminal 404. Symbols 406a and 406b indicate oscillation transistors.

Though the operation of the above described differential type voltage control oscillator is described in detail in, for example, "RF Microelectronic" by Behzad Razavi, edited and translated by Tadahiro Kuroda, Maruzen, 2002, pp. 234-254, of which the detailed descriptions are omitted, differential variable capacitance circuit 405 formed of control voltage terminal 404 and varactor diodes 405a and 405b, as shown in FIG. 4, is used for the operation.

In addition, fixed capacitance switching circuit 508, as shown in FIG. 5, is further added to the configuration of the differential type voltage control oscillator shown in FIG. 4, and thereby, the bandwidth of the variable frequency is attempted to be widened. The same symbols as in FIG. 4 are attached to the corresponding parts in FIG. 5, of which the descriptions are omitted. Symbol 507 indicates a fixed capacitance switching control voltage terminal. In addition, symbols 508a and 508b indicate varactor diodes.

In the following, the operation of the differential type voltage control oscillator is described in reference to FIG. 6. In the graph of FIG. 6, the lateral axis indicates control voltage Vt, which is applied to control voltage terminal 404, while the longitudinal axis indicates the oscillatory frequency of the differential type voltage control oscillator.

FIG. 6 shows a change in the oscillatory frequency relative to control voltage Vt in the case where the fixed capacitance value is set at value A and value B, respectively, by switching the value of the fixed capacitance switching control voltage, which is applied to fixed capacitance switching control voltage terminal 507. As shown in FIG. 6, the band of the oscillatory frequency is switched in accordance with the switched fixed capacitance value A or B, and thereby, the oscillation band can be covered in a wide range.

In addition, a variety of attempts are made to maintain the signal purity of this differential type voltage control oscillator. A differential type PLL circuit as shown in, for example, Japanese Unexamined Patent Publication H7 (1995)-297710 "Improved Phase Lock Loop" is utilized, and thereby, it is attempted to be maintained a high signal purity, in spite of the existence of external noise and noise from the inside of the semiconductor. Such a differential type PLL circuit is described in "RF Microelectronics" by Behzad Razavi, edited and translated by Tadahiro Kuroda, Maruzen, 2002, pp. 271-301, of which the detailed descriptions are omitted.

A conventional differential variable capacitance circuit used for such a differential type PLL circuit has a configuration as shown in FIG. 7, in order to cope with the differential control voltage. In the following, the configuration and the operation of the conventional differential variable capacitance circuit are described in reference to FIG. 7. In FIG. 7, symbol 701 indicates a first differential terminal. Symbol 702 indicates a second differential terminal. Symbol 703 indicates a first capacitor. Symbol 704 indicates a second capacitor. Symbol 705 indicates a first varactor diode. Symbol 706 indicates a second varactor diode. Symbol 707 indicates a first resistor. Symbol 708 indicates a second resistor. Symbol 709 indicates a first control voltage terminal. Symbol 710 indicates a second control voltage terminal. Symbol 711 indicates a third resistor. Symbol 712 indicates a reference voltage terminal.

This differential variable capacitance circuit adds the differential control voltages on the plus side and on the minus side relative to the reference voltage that is supplied to reference voltage terminal 712 to control voltage terminals 709 and 710, respectively, so as to drive varactor diodes 705 and 706 by means of potential differences between the differential control voltages and the reference voltage, and thereby, can change the differential capacitance.

In the above described configuration, however, a problem arises where the differential balance of the capacitance is lost in the differential variable capacitance circuit, increasing noise in common mode in the oscillator and deteriorating the signal purity, in the case where a divergence occurs in the power supply voltage due to a change in the environmental temperature or the affection of switching of the power supply load.

SUMMARY OF THE INVENTION

An object of the present invention is to provide an oscillation device where the output barely depends on the fluctuation of the power supply voltage, the differential balance of the capacitance is not lost, and it is possible to prevent an increase in noise in common mode of the differential type voltage control oscillator.

In order to solve the above described problem, the present invention adopts the configuration wherein differential control voltages having the same temperature properties and power supply voltage fluctuation properties are generated, which are directly connected to the control voltage terminal of the differential variable capacitance circuit so as to drive the varactor diodes by means of the potential difference between the differential control voltages, and the varactor diodes are connected in an anti-parallel manner. As a result of this, an oscillation device can be implemented wherein the output barely depends on the fluctuation in the power supply voltage, the differential balance of the capacitance is not lost, and it is possible to prevent an increase in noise in common mode of the oscillator.

An oscillation device according to the first invention is provided with a differential type voltage control oscillator that includes a differential variable capacitance circuit of which the differential capacitance varies in accordance with the differential control voltage and, a control circuit that provides a differential control voltage to the differential variable capacitance circuit. In addition, a differential variable capacitance circuit is formed of at least one pair of varactor diodes which are connected to each other in an anti-parallel manner, and a group of capacitors for separating the direct currents flowing through the varactor diodes, wherein the differential control voltage of the control circuit is respectively applied to the cathodes and anodes of the varactor diodes.

It is preferable for the above described differential type voltage control oscillator to further include a differential tank circuit and at least a pair of oscillation transistors.

In a first example, the above described control circuit is provided with: a reference signal generator for generating a reference signal; a phase comparator for comparing the phases of a reference signal and an external signal, and for outputting the result of the phase comparison of a phase delay or a phase advance of the external signal relative to the reference signal from the frequency up control output terminal or from the frequency down control output terminal as a frequency up control output or a frequency down control output; at least one first charge pump circuit for outputting a voltage higher than a predetermined first voltage in response to the frequency up control output and for outputting a voltage lower than the first voltage in response to the frequency down control output; and at least one second charge pump circuit for outputting a voltage higher than a predetermined second voltage in response to the frequency down control output and for outputting a voltage lower than the second voltage in response to the frequency up control output.

In addition, the output signal of the differential type voltage control oscillator or a divided signal thereof is inputted into the phase comparator as an external signal, and the output voltage of the first charge pump circuit is respectively added to the cathodes of the varactor diodes as a differential control voltage, and the output voltage of the second charge pump circuit is respectively added to the anodes of the varactor diodes as a differential control voltage.

Here, it is preferable for the output voltage of the first charge pump circuit to be set higher than the output voltage of the second charge pump circuit so that the varactor diodes are driven by the differential control voltage gained from the output voltage of the first charge pump circuit and the output voltage of the second charge pump circuit.

In addition, it is preferable to provide a filter circuit for removing high frequency factors of the output voltage of the first charge pump circuit and of the output voltage of the second charge pump circuit, respectively, and for providing the output voltages of the first and second charge pump circuits to the cathodes and the anodes of the varactor diodes, respectively.

In a second example, the above described control circuit is provided with: a frequency switching control circuit for outputting two switching voltages; at least one first control voltage conversion circuit for outputting a voltage higher than a predetermined first voltage when the output voltage of the frequency switching control circuit is a high voltage, and for outputting a voltage lower than the first voltage when the output voltage of the frequency switching control circuit is a low voltage; and at least one second control voltage conversion circuit for outputting a voltage lower than a predetermined second voltage when the output voltage of the frequency switching control circuit is a high voltage, and for outputting a voltage higher than the second voltage when the output voltage of the frequency switching control circuit is a low voltage.

In addition, the output voltage of the first control voltage conversion circuit is respectively added to the cathodes of the varactor diodes as a differential control voltage, and the output voltage of the second control voltage conversion circuit is respectively added to the anodes of the varactor diodes as a differential control voltage.

Here, it is preferable for the output voltage of the first control voltage conversion circuit to be set higher than the output voltage of the second control voltage conversion circuit so that the varactor diodes are driven by the differential control voltage gained from the output voltage of the first control voltage conversion circuit and the output voltage of the second control voltage conversion circuit.

It is also possible to adopt the following configuration for the oscillation device of the present invention. The differential variable capacitance circuit is formed of a first differential variable capacitance circuit of which the differential capacitance varies in accordance with the first differential control voltage and of a second differential variable capacitance circuit of which the differential capacitance varies in accordance with the second differential control voltage. The first differential variable capacitance circuit is formed of at least one pair of first varactor diodes which are connected to each other in an anti-parallel manner, and a group of first capacitors for separating direct currents flowing through the first varactor diodes. The second differential variable capacitance circuit is formed of at least one pair of second varactor diodes which are connected to each other in an anti-parallel manner, and a group of second capacitors for separating direct currents flowing through the second varactor diodes. The control circuit is formed of a first control circuit for supplying a first differential control voltage to the first differential variable capacitance circuit, and of a second control circuit for supplying a second differential control voltage to the second differential variable capacitance circuit.

The first control circuit is provided with: a reference signal generator for generating a reference signal; a phase comparator for comparing the phases of a reference signal and an external signal, and for outputting the result of the phase comparison of a phase delay or a phase advance of the external signal relative to the reference signal from the frequency up control output terminal or from the frequency down control output terminal as a frequency up control output or a frequency down control output; at least one first charge pump circuit for outputting a voltage higher than a predetermined first voltage in response to the frequency up control output and for outputting a voltage lower than the first voltage in response to the frequency down control output; and at least one second charge pump circuit for outputting a voltage higher than a predetermined second voltage in response to the frequency down control output and for outputting a voltage lower than the second voltage in response to the frequency up control output.

In addition, the output signal of the differential type voltage control oscillator or a divided signal thereof is inputted into the phase comparator as an external signal, and the output voltage of the first charge pump circuit is respectively added to the cathodes of the first varactor diodes as a first differential control voltage, and the output voltage of the second charge pump circuit is respectively added to the anodes of the first varactor diodes as a first differential control voltage.

The second control circuit is provided with: a frequency switching control circuit for out putting two switching voltages; at least one first control voltage conversion circuit for outputting a voltage higher than a predetermined third voltage when the output voltage of the frequency switching control circuit is a high voltage, and for outputting a voltage lower than the third voltage when the output voltage of the frequency switching control circuit is a low voltage; and at least one second control voltage conversion circuit for outputting a voltage lower than a predetermined fourth voltage when the output voltage of the frequency switching control circuit is a high voltage, and for outputting a voltage higher than the fourth voltage when the output voltage of the frequency switching control circuit is a low voltage.

In addition, the output voltage of the first control voltage conversion circuit is respectively added to the cathodes of the second varactor diodes as a differential control voltage, and the output voltage of the second control voltage conversion circuit is respectively added to the anodes of the second varactor diodes as a differential control voltage.

Here, it is preferable for the output voltage of the first charge pump circuit to be set higher than the output voltage of the second charge pump circuit so that the first varactor diodes are driven by the first differential control voltage gained from the output voltage of the first charge pump circuit and the output voltage of the second charge pump circuit. In addition, it is preferable for the output voltage of the first control voltage conversion circuit to be set higher than the output voltage of the second control voltage conversion circuit so that the second varactor diodes are driven by the second differential control voltage gained from the output voltage of the first control voltage conversion circuit and the output voltage of the second control voltage conversion circuit.

A mobile communication apparatus of the second invention is provided with an oscillation device which has the above described configuration.

As described above, the oscillation device and the mobile communication apparatus of the present invention generate differential control voltages having the same temperature properties and power supply voltage fluctuation properties, and connect these differential control voltages directly to the control voltage terminal of the differential variable capacitance circuit so as to drive the varactor diodes by means of the potential difference between the differential control voltages, and in addition, the varactor diodes are connected in an anti-parallel manner, and thereby, it becomes possible to make the output barely dependent on the power supply voltage fluctuation, not to lose the differential balance of the capacitance, and to prevent an increase in noise in common mode of the oscillator.

DETAILED DESCRIPTION OF THE PREFERRED EMBODIMENTS

In the following, the embodiments of the present invention are described in reference to the drawings.

Embodiment 1

Figure 1:
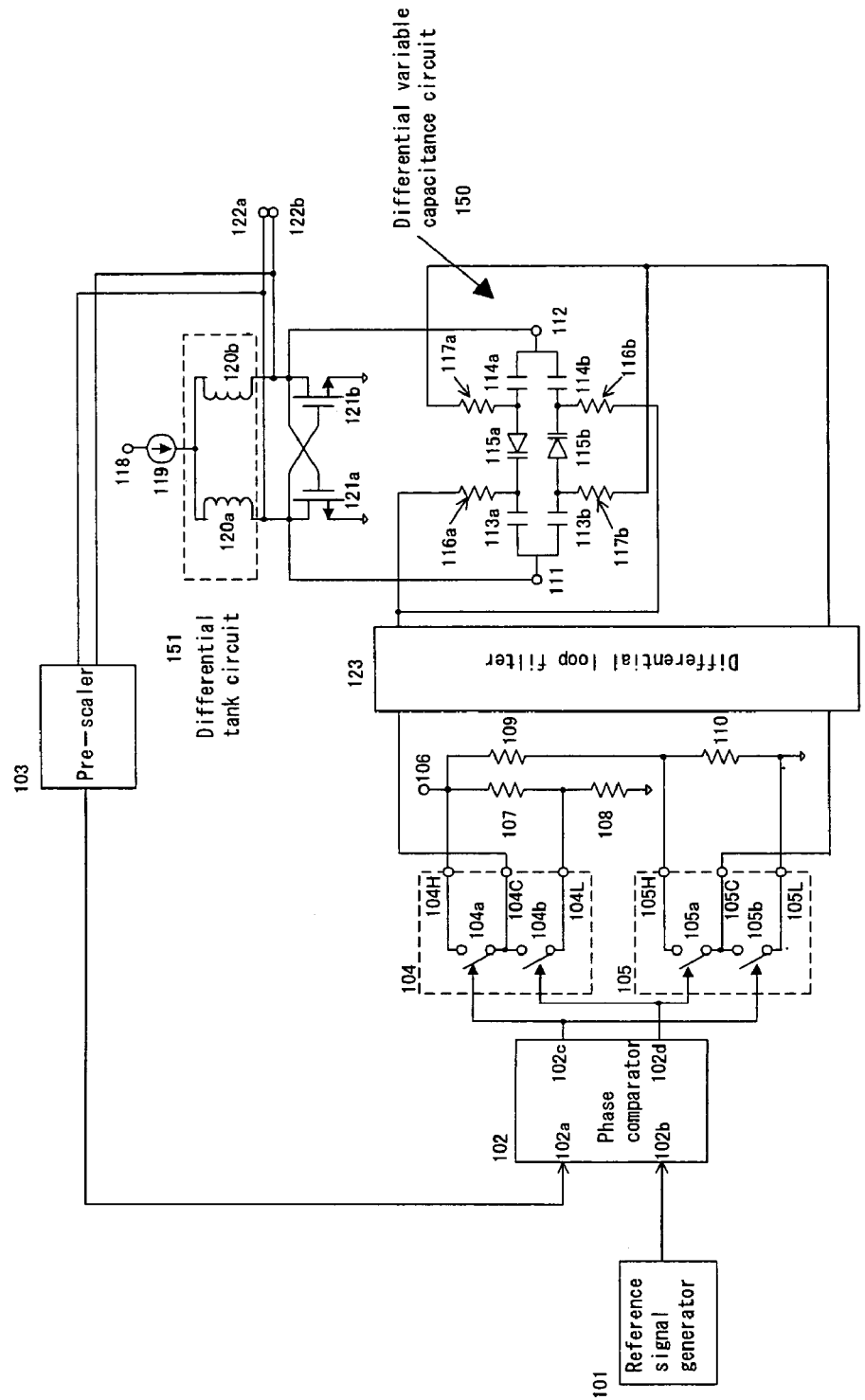
FIG. 1 is a circuit diagram showing the configuration of an oscillation device according to Embodiment 1 of the present invention.

In the following, an oscillation device that forms a PLL circuit according to Embodiment 1 of the present invention is described in reference to the drawings. In FIG. 1, symbol 101 indicates a reference signal generator for generating a reference signal having a frequency that is stable at any temperature.

Symbol 102 indicates a phase comparator, symbols 102a and 102b respectively indicate first and second input terminals, symbol 102c indicates a frequency up control output terminal, and symbol 102d indicates a frequency down control output terminal.

Symbol 103 indicates a pre-scaler for dividing the frequency.

Symbol 104 indicates a first charge pump circuit, symbol 104H indicates a high level voltage terminal, symbol 104L indicates a low level voltage terminal, symbol 104a indicates a high level switching means, symbol 104b indicates a low level switching means, and symbol 104C indicates a first differential output terminal.

Symbol 105 indicates a second charge pump circuit, symbol 105H indicates a high level voltage terminal, symbol 105L indicates a low level voltage terminal, symbol 105a indicates a high level switching means, symbol 105b indicates a low level switching means, and symbol 105C indicates a second differential output terminal.

Symbol 106 indicates a first power supply voltage terminal. Symbol 107 indicates a first voltage dividing resistor. Symbol 108 indicates a second voltage dividing resistor. Symbol 109 indicates a third voltage dividing resistor. Symbol 110 indicates a fourth voltage dividing resistor.

Symbol 111 indicates a first differential terminal. Symbol 112 indicates a second differential terminal. Symbol 113a indicates a first capacitor for separating a direct current. Symbol 113b indicates a second capacitor for separating a direct current. Symbol 114a indicates a third capacitor for separating a direct current. Symbol 114b indicates a fourth capacitor for separating a direct current. Symbol 115a indicates a first varactor diode. Symbol 115b indicates a second varactor diode. Symbol 116a indicates a first resistor. Symbol 116b indicates a second resistor. Symbol 117a indicates a third resistor. Symbol 117b indicates a fourth resistor. The above described first differential terminal 111, second differential terminal 112, first capacitor 113a, second capacitor 113b, third capacitor 114a, fourth capacitor 114b, first varactor diode 115a, second varactor diode 115b, first resistor 116a, second resistor 116b, third resistor 117a, and fourth resistor 117b form a differential variable capacitance circuit 150, where the differential capacitance varies in accordance with the control voltage.

Symbol 118 indicates a second power supply voltage terminal. Symbol 119 indicates a constant current source. Symbol 120a indicates a first inductor. Symbol 120b indicates a second inductor. First inductor 120a and second inductor 120b form a differential tank circuit 151.

Symbol 121a indicates a first oscillation transistor. Symbol 121b indicates a second oscillation transistor. First oscillation transistor 121a, second oscillation transistor 121b, the above described differential tank circuit 151 and differential variable capacitance circuit 150 form a differential type voltage control oscillator.

Symbol 122a indicates a first signal output terminal. Symbol 122b indicates a second signal output terminal. Symbol 123 indicates a loop filter.

Phase comparator 102 compares the phases between the reference signal and an external signal and outputs the phase comparison result of a phase delay or a phase advance of the external signal relative to the reference signal from frequency up control output terminal 102c or frequency down control output terminal 102d as a frequency up control output or a frequency down control output.

First charge pump circuit 104 outputs a voltage higher than a predetermined first voltage in response to the frequency up control output from phase comparator 102, and outputs a voltage lower than the first voltage in response to the frequency down control output from phase comparator 102. Though only one first charge pump circuit 104 is shown in FIG. 1, two or more first charge pump circuits may be provided.

Second charge pump circuit 105 outputs a voltage higher than a predetermined second voltage in response to the frequency down control output from phase comparator 102, and outputs a voltage lower than the second voltage in response to the frequency up control output from phase comparator 102. Though only one second charge pump circuit 105 is shown in FIG. 1, two or more second charge pump circuits may be provided.

Thus, the output voltage of first charge pump circuit 104 is respectively applied to the cathodes of varactor diodes 115a and 115b as a control voltage, and the output voltage of second charge pump circuit 105 is respectively applied to the anodes of varactor diodes 115a and 115b as a control voltage.

In addition, the output voltage of the above described first charge pump circuit 104 is set higher than the output voltage of second charge pump circuit 105 so that at least one pair of varactor diodes 115a and 115b are driven by the differential charge pump voltage gained from the output voltage of first charge pump circuit 104 and the output voltage of second charge pump circuit 105.

Here, the voltage of first power supply voltage terminal 106 corresponds to the voltage higher than the predetermined first voltage, and the voltage of the middle point between first and second voltage dividing resistors 107 and 108 corresponds to the voltage lower than the first voltage. In addition, the voltage of the middle point between third and fourth voltage dividing resistors 109 and 110 corresponds to the voltage higher than the predetermined second voltage and the voltage of the grounding terminal corresponds to the voltage lower than the second voltage. In addition, the voltage of the middle point between first and second resistors 107 and 108 is set higher than the voltage of the middle point between third and fourth resistors 109 and 110.

The operation of this oscillation device is shown in the following. The outputs 122a and 122b of the differential type voltage control oscillator are branched, and the frequencies thereof are divided by using pre-scaler 103, and thereby, the oscillatory frequency is adjusted to the output frequency of reference signal generator 101. Then, phase comparator 102 compares the output of reference signal generator 101 with the output signal of pre-scaler 103 and outputs the compared result from frequency up output terminal 102c and frequency down output terminal 102d.

The potential of first power supply voltage terminal 106 is applied to high level voltage terminal 104H of first charge pump circuit 104, and the potential resulting from the voltage division of the potential of first power supply voltage terminal 106 by first voltage dividing resistor 107 and second voltage dividing resistor 108 is applied to low level voltage terminal 104L of first charge pump circuit 104. In addition, the potential resulting from the voltage division of the potential of first power supply voltage terminal 106 by third voltage dividing resistor 109 and fourth voltage dividing resistor 110 is applied to high lever voltage terminal 105H of second charge pump circuit 105, and the potential of the grounding terminal is applied to low level voltage terminal 105L of second charge pump circuit 105.

Thus, high level switching means 104a of first charge pump circuit 104 is connected between high level voltage terminal 104H and first differential output terminal 104C so that conduction and non-conduction are switched in accordance with high level and low level of the output of frequency up output terminal 102c. In addition, low level switching means 104b is connected between low level voltage terminal 104L and first differential output terminal 104C so that conduction and non-conduction are switched in accordance with high level and low level of the output of frequency down output terminal 102d.

In the same manner, high level switching means 105a of second charge pump circuit 105 is connected between high level voltage terminal 105H and second differential output terminal 105C so that conduction and non-conduction are switched in accordance with high level and low level of the output of frequency down output terminal 102d, and in addition, low level switching means 105b is connected between low level voltage terminal 105L and second differential output terminal 105C so that conduction and non-conduction are switched in accordance with high level and low level of the output of frequency up output terminal 102c.

Thus, differential loop filter 123 suppresses the high frequency component of the differential control voltage, which is an output from first differential output terminal 104C and second differential output terminal 105C, and the control voltage from first differential output terminal 104C is applied to the cathodes of first varactor diode 115a and second varactor diode 115b via first resistor 116a and second resistor 116b, and the control voltage from second differential output terminal 105C is applied to the anodes of first varactor diode 115a and second varactor diode 115b via third resistor 117a and fourth resistor 117b.

As described above, the voltages applied to varactor diodes 115a and 115b so that varactor diodes 115a and 115b are driven by the potential difference between the respective differential control voltages, thereby making the differential capacitance variable so that the oscillatory frequency of the voltage control oscillator that is outputted from output terminals 122a and 122b can be stably controlled.

In the case where a drastic fluctuation in the power supply voltage occurs in the above described oscillation device (PLL circuit), it becomes possible to suppress the fluctuation in the driving voltage of differential variable capacitance circuit 150 because the reference voltage is not utilized as in the prior art, and thus, it becomes possible to reduce the divergence in the oscillatory frequency. Furthermore, first varactor diode 115*a* and second varactor diode 115*b* are connected in an anti-parallel manner, and thereby, an oscillation device (PLL circuit) which is excellent in balancing the impedance for the differential type voltage control oscillator and which has little noise in common mode can be implemented.

Figure 2:
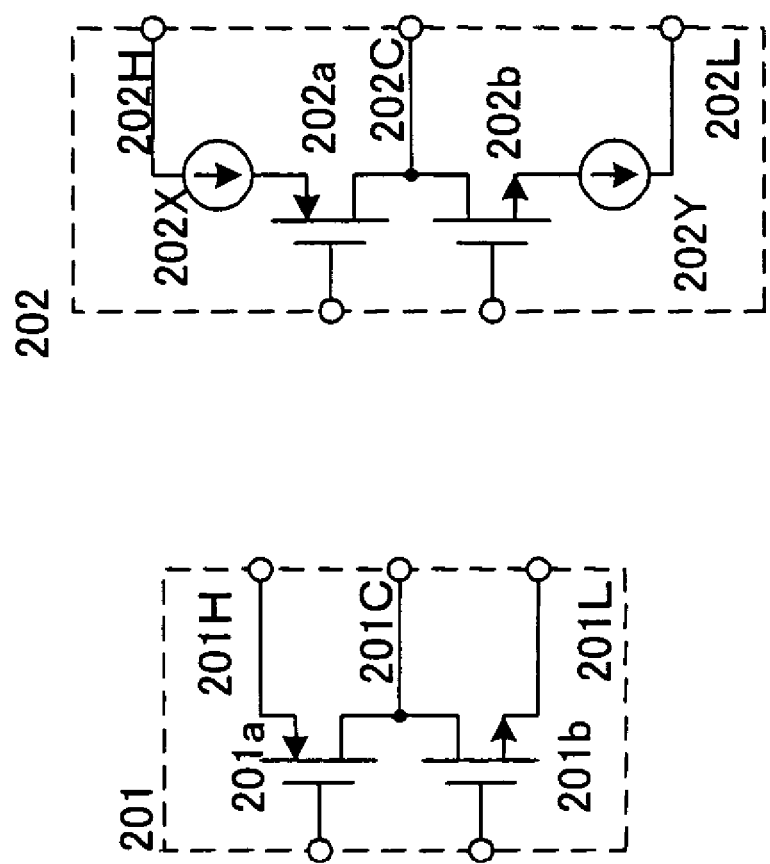
FIGS. 2A and 2B are circuit diagrams showing other circuit examples of the charge pump circuit in the oscillation device according to Embodiment 1 of the present invention.

Here, though a switch is used for the charge pump circuit in the present embodiment, this merely illustrates one example, and it is obvious that the same effects can be gained when the switch is substituted by a circuit, as shown in FIG. 2A or FIG. 2B. In FIG. 2A, symbol 201 shows one example of a charge pump using CMOS transistors. Here, the points having the same functions as those of the charge pump of FIG. 1 are denoted by symbols having the same letter symbols as those in FIG. 1, of which the detailed descriptions are omitted. Symbol 201*a* indicates a p-type MOS transistor, and symbol 201*b* indicates an n-type MOS transistor. Symbol 201H indicates a high level voltage terminal, symbol 201L indicates a low level voltage terminal and symbol 201C indicates a differential output terminal.

In FIG. 2B, symbol 202 indicates an example of a charge pump using CMOS transistors and constant current sources. Symbol 202X indicates a first current source, and symbol 202Y indicates a second current source. The remaining parts are the same as those in FIG. 2A.

Embodiment 2

Figure 3:
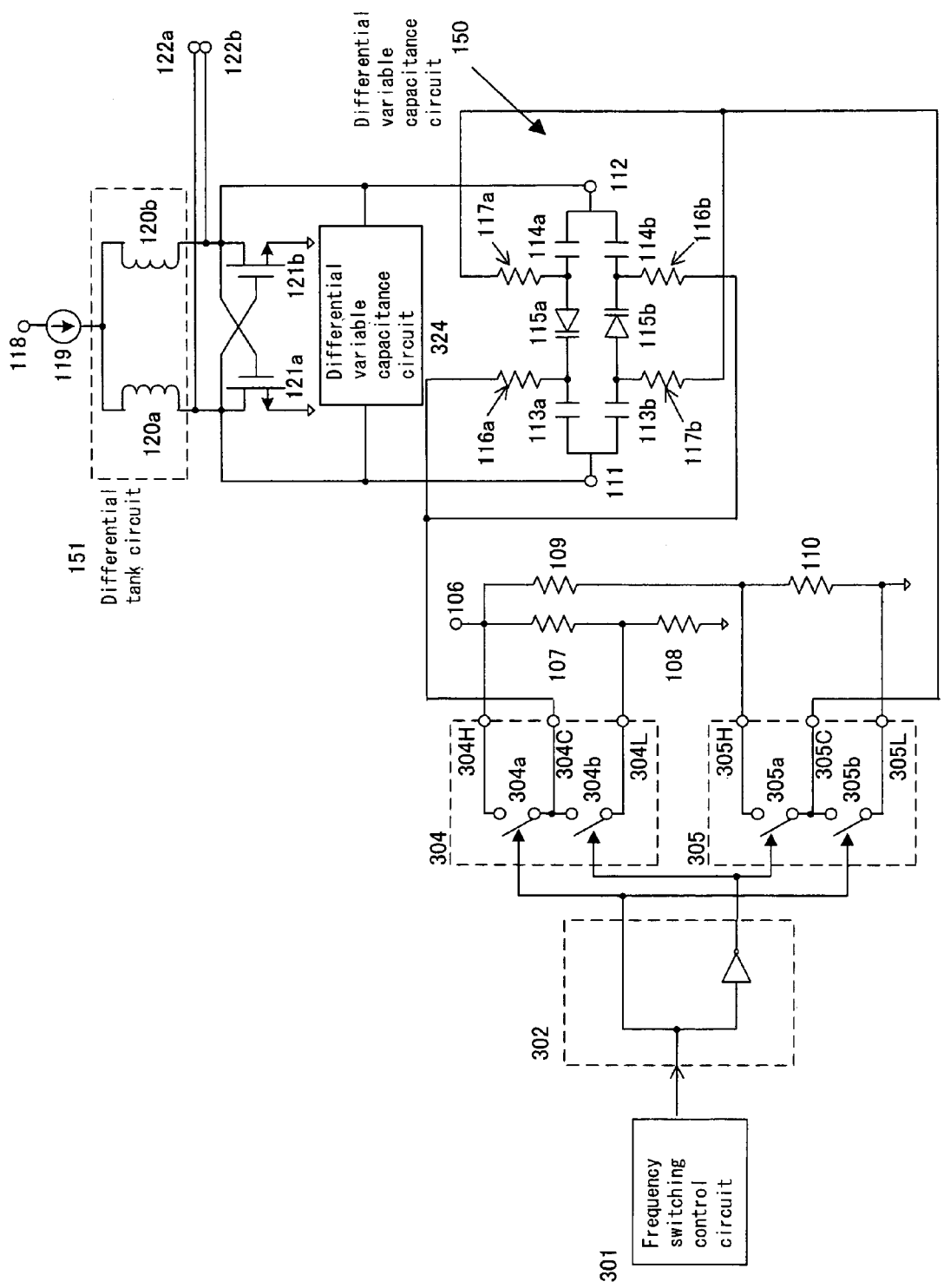
FIG. 3 is a circuit diagram showing the configuration of an oscillation device according to Embodiment 2 of the present invention.
Figure 4:
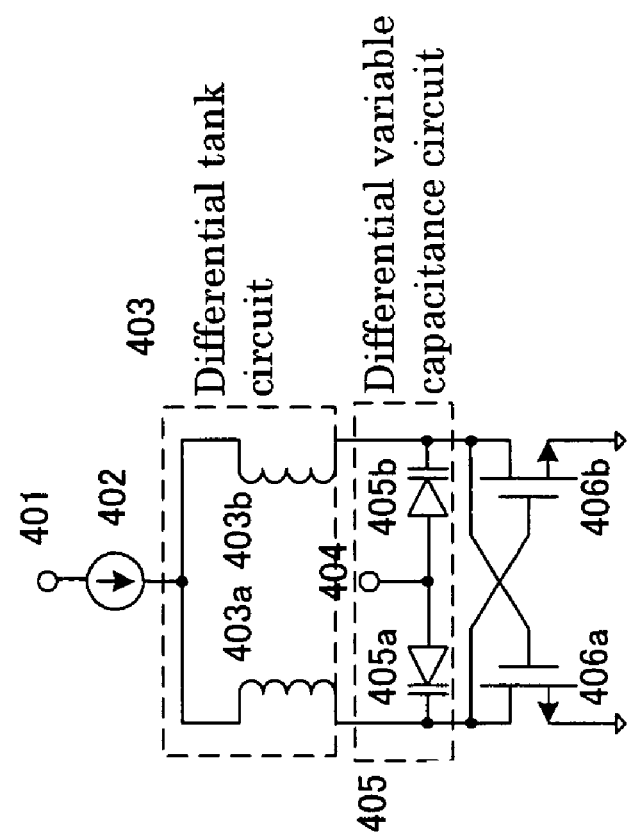
FIG. 4 is a circuit diagram showing the configuration of a differential type voltage control oscillator according to the prior art.
Figure 5:
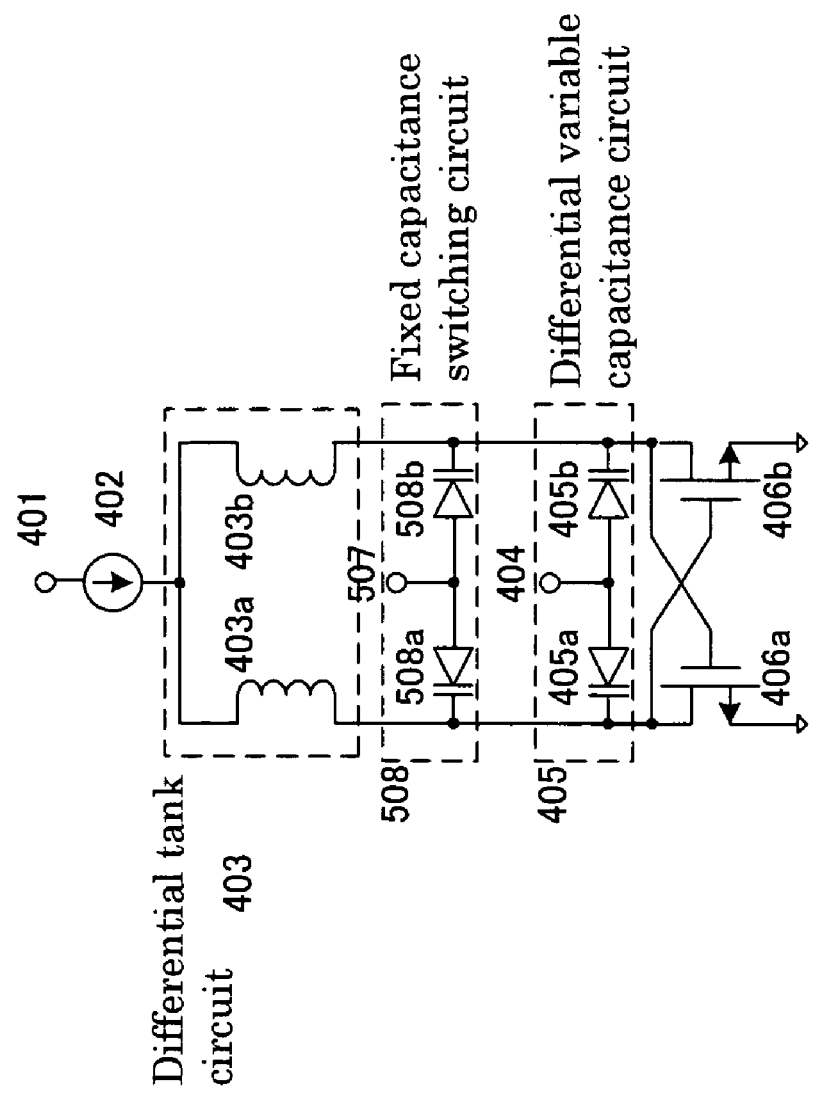
FIG. 5 is a circuit diagram showing the configuration of a differential type voltage control oscillator to which a fixed capacitance switching circuit is added according to the prior art.
Figure 6:
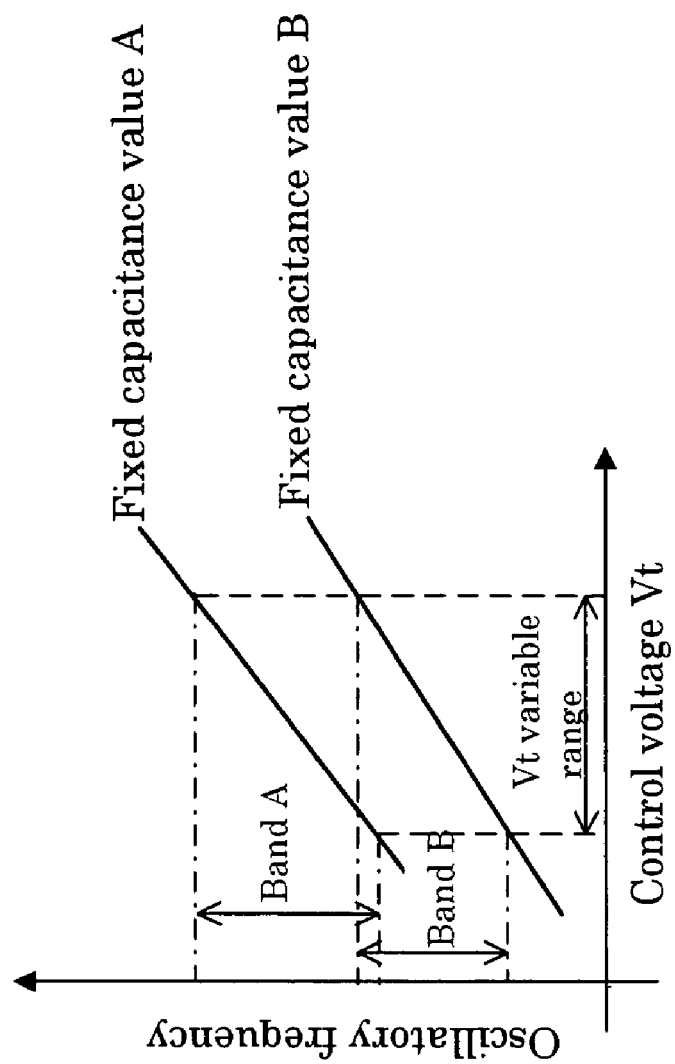
FIG. 6 is a graph showing the characteristics of the control range of the oscillatory frequency in the differential type voltage control oscillator of FIG. 5.
Figure 7:
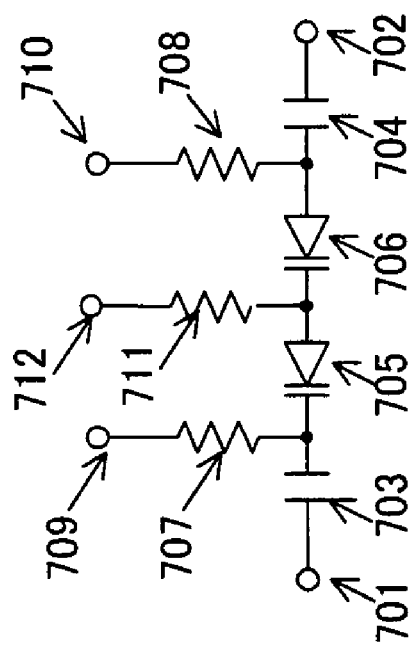
FIG. 7 is a circuit diagram showing a differential variable capacitance circuit according to the prior art.

Next, an oscillation device that forms a PLL circuit according to Embodiment 2 of the present invention is described in reference to FIG. 3. In FIG. 3, the same symbols are attached to the parts which are the same as those in FIG. 1, of which the descriptions are omitted. In FIG. 3, symbol 301 indicates a frequency switching control circuit for generating two or more frequency switching voltages (or band switching voltages).

Symbol 302 indicates an inverted signal generation circuit which outputs the output voltage of frequency switching control circuit 301 without change, and which inverts the output of frequency switching control circuit 301, which is then outputted.

Symbol 304 indicates a first control voltage conversion circuit, symbol 304H indicates a high level voltage terminal, symbol 304L indicates a low level voltage terminal, symbol 304*a* indicates a high level switching means, symbol 304*b* indicates a low level switching means, and symbol 304C indicates a first control output terminal.

Symbol 305 indicates a second control voltage conversion circuit, symbol 305H indicates a high level voltage terminal, symbol 305L indicates a low level voltage terminal, symbol 305*a* indicates a high level switching means, symbol 305*b* indicates a low level switching means, and symbol 305C indicates a second control output terminal.

First control voltage conversion circuit 304 outputs a voltage higher than a predetermined first voltage when the output voltage of frequency switching control circuit 301 is a high voltage, and outputs a voltage lower than the first voltage when the output voltage of frequency switching control circuit 301 is a low voltage. Though only one first control voltage conversion circuit 304 is shown in FIG. 3, two or more first control voltage conversion circuits may be provided.

Second control voltage conversion circuit 305 outputs a voltage higher than a predetermined second voltage when the output voltage of frequency switching control circuit 301 is a high voltage, and outputs a voltage lower than the second voltage when the output voltage of frequency switching control circuit 301 is a low voltage. Though only one second control voltage conversion circuit 305 is shown in FIG. 3, two or more second control voltage conversion circuits may be provided.

Thus, the output voltage of first control voltage conversion circuit 304 is respectively applied to the cathodes of varactor diodes 115*a* and 115*b* as a control voltage, and the output voltage of second control voltage conversion circuit 305 is respectively applied to the anodes of varactor diodes 115*a* and 115*b* as a control voltage. Furthermore, the output voltage of first control voltage conversion circuit 304 is set higher than the output voltage of second control voltage conversion circuit 305 so that varactor diodes 115*a* and 115*b* are driven by the differential control voltage gained from the output voltage of first control voltage conversion circuit 304 and the output voltage of second control voltage conversion circuit 305.

Symbol 324 indicates a differential variable capacitance circuit. This differential variable capacitance circuit 324 can vary the capacitance in accordance with the control with the voltage, and is utilized in order to form, for example, a PLL circuit. Here, the configurations of a reference signal generation circuit, a pre-scaler, a phase comparator, first and second charge pump circuits, a differential loop filter and the like for forming a PLL circuit are omitted from the illustration.

The operation of this oscillation device is shown in the following. The frequency switching control signal that has been generated in frequency switching control circuit 301 is inputted into inverted signal generation circuit 302, which outputs the original non-inverted control signal and an inverted signal.

The potential of first power supply voltage terminal 106 is applied to high level voltage terminal 304H of first control voltage conversion circuit 304, and the potential resulting from the voltage division of the potential of first power supply voltage terminal 104 by first voltage dividing resistor 107 and second voltage dividing resistor 108 is applied to low level voltage terminal 304L of first control voltage conversion circuit 304. In addition, the potential resulting from the voltage division of the potential of first power supply voltage terminal 106 by third voltage dividing resistor 109 and fourth voltage dividing resistor 110 is applied to high level voltage terminal 305H of second control voltage conversion circuit 305, and the potential of the grounding terminal is applied to low level voltage terminal 305L of second control voltage conversion circuit 305.

Thus, high level switching means 304*a* of first control voltage conversion circuit 304 is connected between high level voltage terminal 304H and first control output terminal 304C so that conduction and non-conduction are switched in accordance with the high level and the low level of the non-inverted control signal. In addition, low level switching means 304*b* is connected between low level voltage terminal 304L and first control output terminal 304C so that conduction and non-conduction are switched in accordance with the high level and the low level of the inverted output.

In the same manner, high level switching means 305*a* of second control voltage conversion circuit 354 is connected between high level voltage terminal 305H and second control output terminal 305C so that conduction and non-conduction are switched in accordance with the high level and the low level of the inverted output, and low level switching means 305b is connected between low level voltage terminal 305L and second control output terminal 305C so that conduction and non-conduction are switched in accordance with the high level and the low level of the non-inverted control signal.

Thus, the control voltage from first control output terminal 304C is applied to the cathodes of first varactor diode 115a and second varactor diode 115b via first resistor 116a and second resistor 116b, and the control voltage from second control output terminal 305C is applied to the anodes of first varactor diode 115a and second varactor diode 115b via third resistor 117a and fourth resistor 117b.

As described above, the voltages are applied to varactor diodes 115a and 115b so that varactor diodes 115a and 115b are driven by the potential difference between the respective differential control voltages, thereby switching the differential capacitances so that the oscillatory frequency of the oscillator that is outputted from output terminals 122a and 122b can be stably switched and controlled.

In the present embodiment, the differential capacitances are switched for the switching of the frequency without using the reference voltage, in the same manner as in the first embodiment, and therefore, it becomes possible to suppress the effects of the fluctuation in the power supply voltage on the oscillatory frequency.

Here, the same configuration as the configuration of the first embodiment can be used for differential variable capacitance circuit 324 of the present embodiment. Control over the differential variable capacitance circuits in the present embodiment and in Embodiment 1 are independent of each other, and therefore, the two may be combined for the utilization, and in this case, it is clear that a more stable oscillatory frequency can be gained.

In addition, though in the above described embodiment 2, a configuration for switching the two oscillatory frequencies, high and low, is described, three or more frequencies may be switched. In this case, it is necessary for frequency switching circuit 301 to be formed so as to output a frequency switching signal for switching three or more frequencies. In addition, it is also necessary for control voltage conversion circuits 304 and 305 to be formed so as to be able to selectively output three or more different voltages, respectively, in response to the frequency switching signal. The output voltage of control voltage conversion circuit 304 is naturally set to its highest value in the case where the frequency is switched to the highest, and is set to its lowest value in the case where the frequency is switched to the lowest. On the other hand, the output voltage of control voltage conversion circuit 305 is set to its lowest value in the case where the frequency is switched to the highest, and is set to its highest value in the case where the frequency is switched to the lowest. In addition, it naturally becomes necessary to modify inverted signal generation circuit 302 in order to correspond to the circuit modifications of frequency switching control circuit 301 and control voltage conversion circuits 304 and 305.

Here, though in Embodiments 1 and 2, the potential supplied to the high level voltage terminal or the low level voltage terminal of the charge pump circuit or the control voltage switching circuit is generated through the voltage division by resistors, the same effects can be gained in any circuit, as long as the circuit performs the same functions in a manner where the temperature properties or the like are the same and comparative changes are small in the combination of the components.

In addition, though in Embodiments 1 and 2, resistors 116a, 116b, 117a and 117b are used in order to separate the DC component of the control voltage from the high frequency component of the differential variable circuit, this merely illustrates an example, and any elements may be used, as long as the circuit performs the same function.

Embodiment 3

Figure 8:
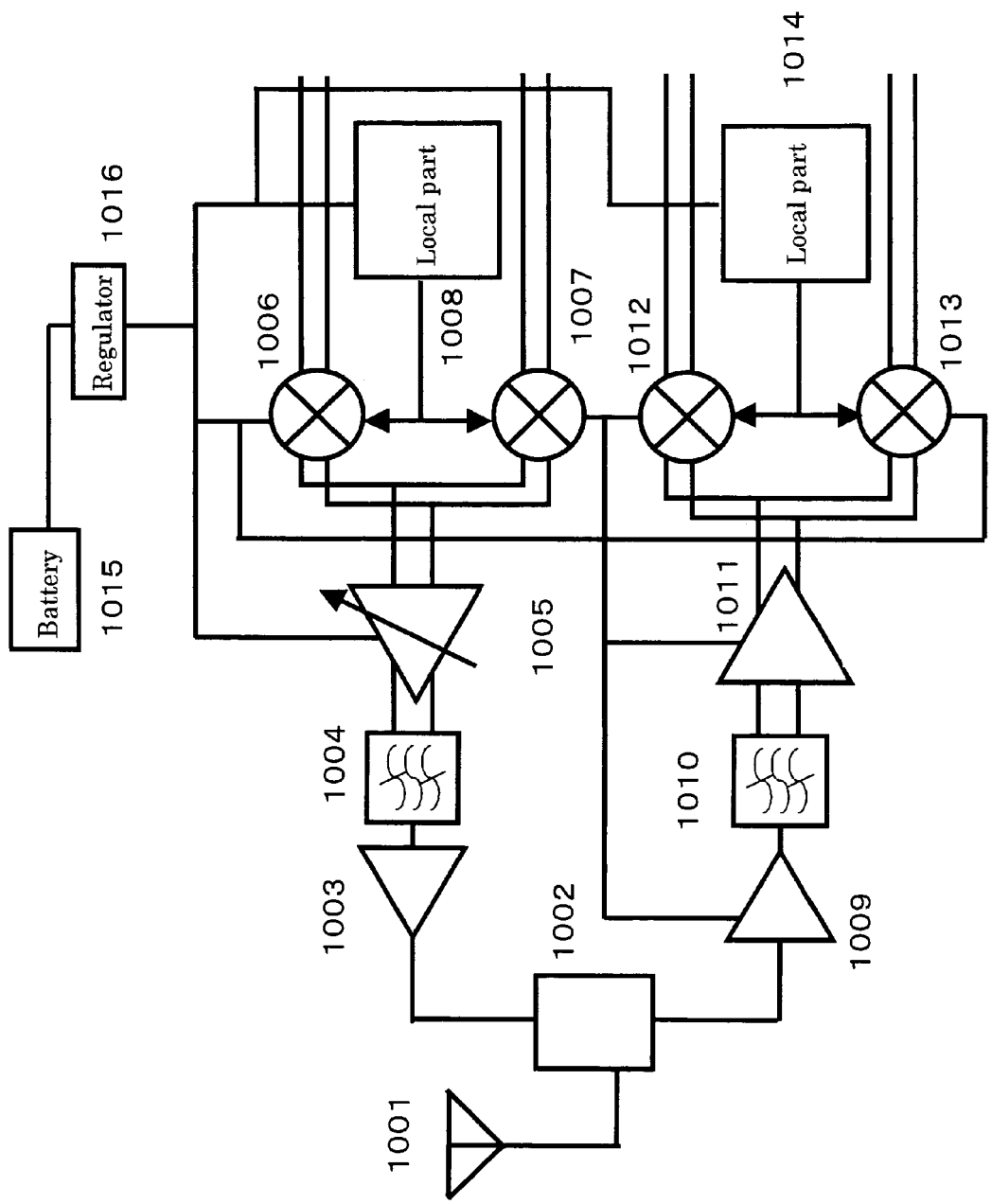
FIG. 8 is a block diagram showing mobile communication apparatus according to Embodiment 3 of the present invention.

Next, the configuration of a mobile communication apparatus using the oscillation device of Embodiment 1 or 2 as a local part (local oscillator) is described in reference to FIG. 8. In FIG. 8, symbol 1001 indicates an antenna and symbol 1002 indicates an antenna duplexer. Symbol 1003 indicates an amplifier, symbol 1004 indicates a filter, symbol 1005 indicates a gain control amplifier, symbols 1006 and 1007 indicate respective modulators, and symbol 1008 indicates a local part utilizing an oscillation device of the present invention. Symbol 1009 indicates an amplifier, symbol 1010 indicates a filter, symbol 1011 indicates an amplifier, symbols 1012 and 1013 indicate respective demodulators, and symbol 1014 indicates a local part utilizing an oscillation device of the present invention. Symbol 1015 indicates a battery and symbol 1016 indicates a power supply regulator.

In a mobile communication apparatus of the present embodiment, the voltage of battery 1015 is stabilized by a single power supply regulator 1016, and the output voltage of power supply regulator 1016 is commonly applied to, for example, gain control amplifier 1005, modulators 1006, 1007, local part 1008, amplifier 1009, 1011, demodulators 1012, 1013 and local part 1014 as a power supply voltage.

Figure 9:
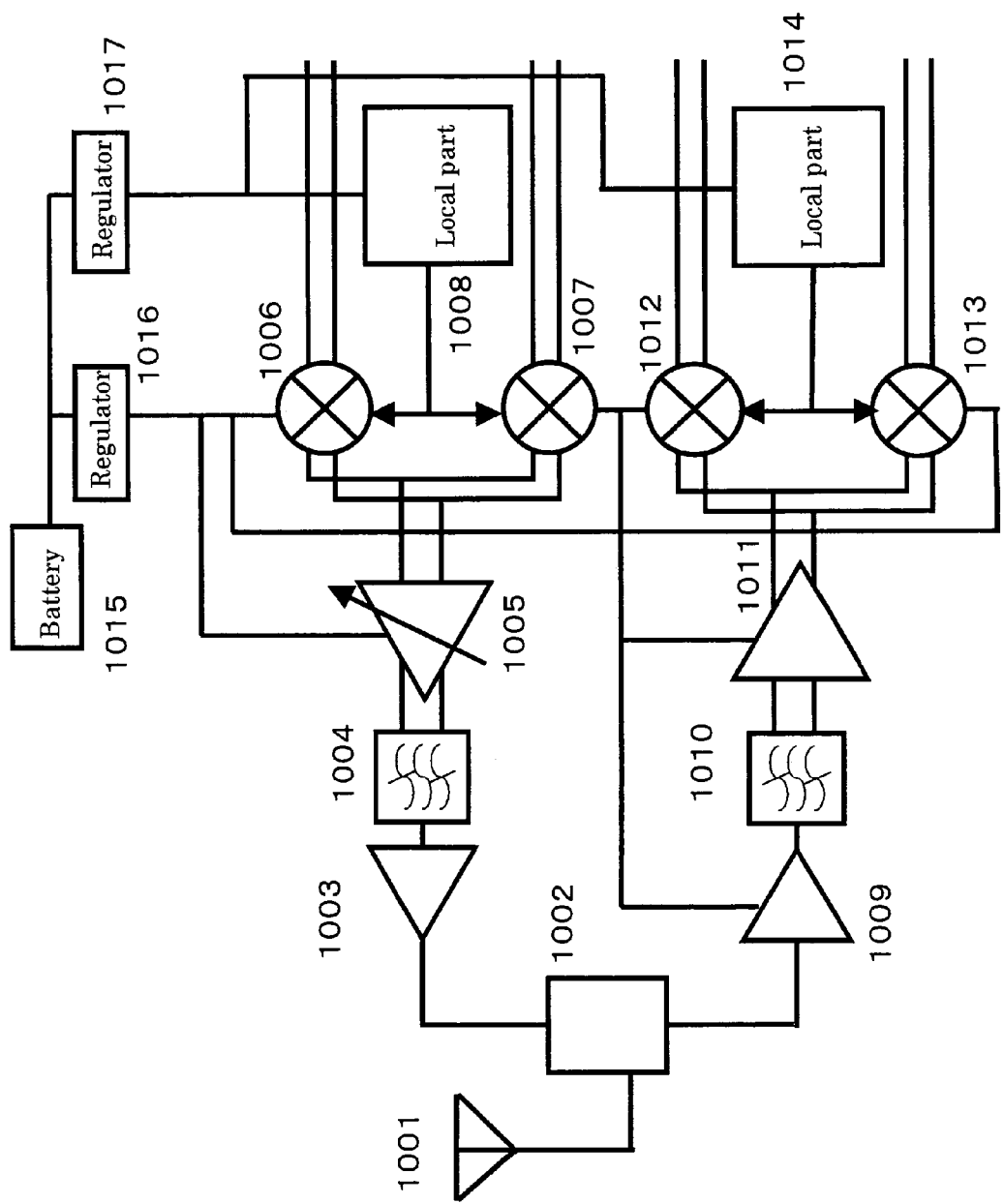
FIG. 9 is a block diagram showing a mobile communication apparatus according to the prior art.

According to the prior art, however, as shown in FIG. 9, another regulator 1017 is provided in addition to power supply regulator 1016 so that power supply regulator 1017 is dedicated to local parts 1008 and 1014, and power supply regulator 1016 is utilized for gain control amplifier 1005, modulators 1006, 1007, amplifier 1009, 1011, demodulators 1012 and 1013.

This is because of the following. There has been a problem where a local part (oscillation device) is easily affected by the fluctuation in the power supply voltage, and thereby, noise in common mode increases, according to the prior art. In order to reduce noise in common mode, it is required for the power supply voltage that is supplied from the power supply regulator to the local part to be maintained at a constant value as much as possible.

Thus, as described above, power supply regulator 1017 dedicated to local parts 1008 and 1014 is provided, in addition to power supply regulator 1016 for supplying a power supply voltage to gain control amplifier 1005, modulators 1006, 1007, amplifier 1009, 1011, demodulators 1012 and 1013 according to the prior art, so as to prevent the local parts from being affected by the fluctuation in the power supply voltage that accompanies a change in currents flowing through gain control amplifier 1005, modulators 1006, 1007, amplifier 1009, 1011 and demodulators 1012 and 1013. As a result of this, problems have arisen such as an increase in the device area at the time of integration, and an increase in the cost of manufacture.

In the configuration of the above described Embodiment 3, however, local parts (oscillation devices) 1008 and 1014 have configurations that are not easily affected by the fluctuation in the power supply voltage, and therefore, noise in common mode is not easily increased, even in the case where power supply regulator 1016 is commonly used for gain control amplifier 1005, modulators 1006, 1007, amplifier 1009, 1011, demodulators 1012, 1013 and local parts 1008 and 1014. As a result of this, one power supply regulator can be eliminated, thereby reducing the device area at the time of integration and the cost of manufacture.

Here, in the case where a mobile communication apparatus has a configuration where one power supply regulator is commonly used for a gain control amplifier, modulators and a local part, the power supply voltage that is applied to the local part varies because of the following reasons. When, currents flowing through the gain control amplifier and the modulators change to a great extent due to a change in the output level or the like, the voltage drop in the wire resistance changes between the power supply regulator and the gain control amplifier, between the power supply regulator and the modulators as well as between the power supply regulator and the local part, and thereby, the power supply voltage that is applied to the local part changes to a great extent.

INDUSTRIAL APPLICABILITY

An oscillation device according to the present invention has such effects that the oscillation device does not easily depend on the fluctuation in the power supply voltage, the differential balance in the capacitance is not lost, and it becomes possible to prevent an increase in noise in common mode of the oscillator, and thus, is useful as an oscillation device or the like that is utilized for a wireless terminal device of, for example, a mobile communication apparatus.

The invention claimed is:

1. An oscillation device, comprising:
   a differential type voltage control oscillator that includes a differential variable capacitance circuit of which the differential capacitance varies in accordance with a differential control voltage; and
   a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and
   wherein said control circuit comprises:
   a reference signal generator for generating a reference signal;
   a phase comparator which compares the phase between said reference signal and an external signal, and which outputs the phase comparison result of a phase delay or a phase advance of said external signal relative to said reference signal from a frequency up control output terminal or from a frequency down control output terminal, as a frequency up control output or as a frequency down control output;
   at least one first charge pump circuit which outputs a voltage higher than a predetermined first voltage in response to said frequency up control output, and which outputs a voltage lower than said first voltage in response to said frequency down control output; and
   at least one second charge pump circuit which outputs a voltage higher than a predetermined second voltage in response to said frequency up control output, and which outputs a voltage lower than said second voltage in response to said frequency down control output, wherein an output signal of said differential type voltage control oscillator or a frequency dividing signal thereof is inputted into said phase comparator as said external signal, and an output voltage of said first charge pump circuit is respectively applied to the cathodes of said varactor diodes as said differential control voltage, and an output voltage of said second charge pump circuit is respectively applied to the anodes of said varactor diodes as said differential control voltage.

2. The oscillation device according to claim 1, wherein said differential type voltage control oscillator further includes a differential tank circuit and at least one pair of oscillation transistors.

3. The oscillation device according to claim 1, wherein the output voltage of said first charge pump circuit is set higher than the output voltage of said second charge pump circuit, and said varactor diodes are driven by said differential control voltage gained from the output voltage of said first charge pump circuit and from the output voltage of said second charge pump circuit.

4. The oscillation device according to claim 1, provided with a filter circuit for removing high frequency components from the output voltage of said first charge pump circuit and from the output voltage of said second charge pump circuit, respectively, which are then supplied to the cathodes and to the anodes of said varactor diodes, respectively.

5. An oscillation device, comprising:
   a differential type voltage control oscillator that includes a differential variable capacitance circuit of which the differential capacitance varies in accordance with a differential control voltage; and
   a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and
   wherein said control circuit comprises: a frequency switching control circuit for outputting two switching voltages; at least one first control voltage conversion circuit which outputs a voltage higher than a predetermined first voltage when an output voltage of said frequency switching control circuit is a high voltage, and which outputs a voltage lower than said first voltage when an output voltage of said frequency switching control circuit is a low voltage; and at least one second control voltage conversion circuit which outputs a voltage higher than a predetermined second voltage when an output voltage of said frequency switching control circuit is a high voltage, and which outputs a voltage lower than said second voltage when an output voltage of said frequency switching control circuit is a low voltage, wherein the output voltage of the first control voltage conversion circuit is respectively applied to the cathodes of said varactor diodes as said differential control voltage, and the output voltage of the second control voltage conversion circuit is respectively applied to the anodes of said varactor diodes as said differential control voltage.

6. The oscillation device according to claim 5, wherein the output voltage of said first control voltage conversion circuit is set higher than the output voltage of said second control voltage conversion circuit, and said varactor diodes are driven by said differential control voltage gained from the output voltage of said first control voltage conversion circuit and from the output voltage of said second control voltage conversion circuit.

7. An oscillation device, comprising:
a differential type voltage control oscillator that includes a differential variable capacitance circuit of which the differential capacitance varies in accordance with a differential control voltage; and
a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and
wherein said differential variable capacitance circuit is formed of a first differential variable capacitance circuit of which the differential capacitance varies in accordance with a first differential control voltage, and of a second differential variable capacitance circuit of which the differential capacitance varies in accordance with a second differential control voltage, said first differential variable capacitance circuit is formed of at least one pair of first varactor diodes which are connected to each other in an anti-parallel manner, and of a first group of capacitors for separating direct currents flowing through said first varactor diodes, said second differential variable capacitance circuit is formed of at least one pair of second varactor diodes which are connected to each other in an anti-parallel manner, and of a second group of capacitors for separating direct currents flowing through said second varactor diodes, said control circuit is formed of a first control circuit for supplying said first differential control voltage to said first differential variable capacitance circuit, and of a second control circuit for supplying said second differential control voltage to said second differential variable capacitance circuit, said first control circuit comprises: a reference signal generator for generating a reference signal; a phase comparator which compares the phase between said reference signal and an external signal, and which outputs the phase comparison result of a phase delay or a phase advance of said external signal relative to said reference signal from a frequency up control output terminal or from a frequency down control output terminal, as a frequency up control output or as a frequency down control output; at least one first charge pump circuit which outputs a voltage higher than a predetermined first voltage in response to said frequency up control output, and which outputs a voltage lower than said first voltage in response to said frequency down control output; and at least one second charge pump circuit which outputs a voltage higher than a predetermined second voltage in response to said frequency up control output, and which outputs a voltage lower than said second voltage in response to said frequency down control output, wherein an output signal of said differential type voltage control oscillator or a frequency dividing signal thereof is inputted into said phase comparator as said external signal, and an output voltage of said first charge pump circuit is respectively applied to the cathodes of said first varactor diodes as said first differential control voltage, and an output voltage of said second charge pump circuit is respectively applied to the anodes of said first varactor diodes as said first differential control voltage, and said second control circuit comprises: a frequency switching control circuit for outputting two switching voltages; at least one first control voltage conversion circuit which outputs a voltage higher than a predetermined third voltage when an output voltage of said frequency switching control circuit is a high voltage, and which outputs a voltage lower than said third voltage when an output voltage of said frequency switching control circuit is a low voltage; and at least one second control voltage conversion circuit which outputs a voltage higher than a predetermined fourth voltage when an output voltage of said frequency switching control circuit is a high voltage, and which outputs a voltage lower than said fourth voltage when an output voltage of said frequency switching control circuit is a low voltage, wherein the output voltage of the first control voltage conversion circuit is respectively applied to the cathodes of said second varactor diodes as said second differential control voltage, and the output voltage of the second control voltage conversion circuit is respectively applied to the anodes of said second varactor diodes as said second differential control voltage.

8. The oscillation device according to claim 7, wherein the output voltage of said first charge pump circuit is set higher than the output voltage of said second charge pump circuit, and said first varactor diodes are driven by said first differential control voltage gained from the output voltage of said first charge pump circuit and from the output voltage of said second charge pump circuit, and the output voltage of said first control voltage conversion circuit is set higher than the output voltage of said second control voltage conversion circuit, and said second varactor diodes are driven by said second differential control voltage gained from the output voltage of said first control voltage conversion circuit and from the output voltage of said second control voltage conversion circuit.

9. A mobile communication apparatus with an oscillation device, wherein said oscillation device comprises: a differential type voltage control oscillator that includes a differential variable capacitance circuit of which the differential capacitance varies in accordance with a differential control voltage; and a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and wherein said control circuit comprises: a reference signal generator for generating a reference signal; a phase comparator which compares the phase between said reference signal and an external signal, and which outputs the phase comparison result of a phase delay or a phase advance of said external signal relative to said reference signal from a frequency up control output terminal or from a frequency down control output terminal, as a frequency up control output or as a frequency down control output; at least one first charge pump circuit which outputs a voltage higher than a predetermined first voltage in response to said frequency up control output, and which outputs a voltage lower than said first voltage in response to said frequency down control output; and at least one second charge pump circuit which outputs a voltage higher than a predetermined second voltage in response to said frequency up control output, and which outputs a voltage lower than said second voltage in response to said frequency down control output, wherein an output signal of said differential type voltage control oscillator or a frequency dividing signal thereof is inputted into said phase comparator as said external signal, and an output voltage of said first charge pump circuit is respectively applied to the cathodes of said varactor diodes as said differential control voltage, and an output voltage of said second charge pump circuit is respectively applied to the anodes of said varactor diodes as said differential control voltage.

10. The mobile communication apparatus according to claim 9, wherein said differential type voltage control oscillator further includes a differential tank circuit and at least one pair of oscillation transistors.

11. The mobile communication apparatus according to claim 9, wherein the output voltage of said first charge pump circuit is set higher than the output voltage of said second charge pump circuit, and said varactor diodes are driven by said differential control voltage gained from the output voltage of said first charge pump circuit and from the output voltage of said second charge pump circuit.

12. The mobile communication apparatus according to claim 9, provided with a filter circuit for removing high frequency components from the output voltage of said first charge pump circuit and from the output voltage of said second charge pump circuit, respectively, which are then supplied to the cathodes and to the anodes of said varactor diodes, respectively.

13. A mobile communication apparatus with an oscillation device, wherein said oscillation device comprises: a differential type voltage control oscillator that includes a differential variable capacitance circuit of which the differential capacitance varies in accordance with a differential control voltage; and a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and wherein said control circuit comprises: a frequency switching control circuit for outputting two switching voltages; at least one first control voltage conversion circuit which outputs a voltage higher than a predetermined first voltage when an output voltage of said frequency switching control circuit is a high voltage, and which outputs a voltage lower than said first voltage when an output voltage of said frequency switching control circuit is a low voltage; and at least one second control voltage conversion circuit which outputs a voltage higher than a predetermined second voltage when an output voltage of said frequency switching control circuit is a high voltage, and which outputs a voltage lower than said second voltage when an output voltage of said frequency switching control circuit is a low voltage, wherein the output voltage of the first control voltage conversion circuit is respectively applied to the cathodes of said varactor diodes as said differential control voltage, and the output voltage of the second control voltage conversion circuit is respectively applied to the anodes of said varactor diodes as said differential control voltage.

14. The mobile communication apparatus according to claim 13, wherein the output voltage of said first control voltage conversion circuit is set higher than the output voltage of said second control voltage conversion circuit, and said varactor diodes are driven by said differential control voltage gained from the output voltage of said first control voltage conversion circuit and from the output voltage of said second control voltage conversion circuit.

15. A mobile communication apparatus with an oscillation device, wherein said oscillation device comprises: a differential type voltage control oscillator that includes a differential variable capacitance circuit of which the differential capacitance varies in accordance with a differential control voltage; and a control circuit for supplying said differential control voltage to said differential variable capacitance circuit, wherein said differential variable capacitance circuit is formed of at least one pair of varactor diodes which are connected to each other in an anti-parallel manner, and of a group of capacitors for separating direct currents flowing through said varactor diodes, and said differential control voltage of said control circuit is respectively applied to the cathodes and the anodes of said varactor diodes, and wherein said differential variable capacitance circuit is formed of a first differential variable capacitance circuit of which the differential capacitance varies in accordance with a first differential control voltage, and of a second differential variable capacitance circuit of which the differential capacitance varies in accordance with a second differential control voltage, said first differential variable capacitance circuit is formed of at least one pair of first varactor diodes which are connected to each other in an anti-parallel manner, and of a first group of capacitors for separating direct currents flowing through said first varactor diodes, said second differential variable capacitance circuit is formed of at least one pair of second varactor diodes which are connected to each other in an anti-parallel manner, and of a second group of capacitors for separating direct currents flowing through said second varactor diodes, said control circuit is formed of a first control circuit for supplying said first differential control voltage to said first differential variable capacitance circuit, and of a second control circuit for supplying said second differential control voltage to said second differential variable capacitance circuit, said first control circuit comprises: a reference signal generator for generating a reference signal; a phase comparator which compares the phase between said reference signal and an external signal, and which outputs the phase comparison result of a phase delay or a phase advance of said external signal relative to said reference signal from a frequency up control output terminal or from a frequency down control output terminal, as a frequency up control output or as a frequency down control output; at least one first charge pump circuit which outputs a voltage higher than a predetermined first voltage in response to said frequency up control output, and which outputs a voltage lower than said first voltage in response to said frequency down control output; and at least one second charge pump circuit which outputs a voltage higher than a predetermined second voltage in response to said frequency up control output, and which outputs a voltage lower than said second voltage in response to said frequency down control output, wherein an output signal of said differential type voltage control oscillator or a frequency dividing signal thereof is inputted into said phase comparator as said external signal, and an output voltage of said first charge pump circuit is respectively applied to the cathodes of said first varactor diodes as said first differential control voltage, and an output voltage of said second charge pump circuit is respectively applied to the anodes of said first varactor diodes as said first differential control voltage, and said second control circuit comprises: a frequency switching control circuit for outputting two switching voltages; at least one first control voltage conversion circuit which outputs a voltage higher than a predetermined third voltage when an output voltage of said frequency switching control circuit is a high voltage, and which outputs a voltage lower than said third voltage when an output voltage of said frequency switching control circuit is a low voltage; and at least one second control voltage conversion circuit which outputs a voltage higher than a predetermined fourth voltage when an output voltage of said frequency switching control circuit is a high voltage, and which outputs a voltage lower than said fourth voltage when an output voltage of said frequency switching control circuit is a low voltage, wherein the output voltage of the first control voltage conversion circuit is respectively applied to the cathodes of said second varactor diodes as said second differential control voltage, and the output voltage of the second control voltage conversion circuit is respectively applied to the anodes of said second varactor diodes as said second differential control voltage.

16. The mobile communication device according to claim 15, wherein the output voltage of said first charge pump circuit is set higher than the output voltage of said second charge pump circuit, and said first varactor diodes are driven by said first differential control voltage gained from the output voltage of said first charge pump circuit and from the output voltage of said second charge pump circuit, and the output voltage of said first control voltage conversion circuit is set higher than the output voltage of said second control voltage conversion circuit, and said second varactor diodes are driven by said second differential control voltage gained from the output voltage of said first control voltage conversion circuit and from the output voltage of said second control voltage conversion circuit.

* * * * *